United States Patent
Kim

(10) Patent No.: US 9,915,933 B2
(45) Date of Patent: Mar. 13, 2018

(54) SYSTEM-ON-CHIP INCLUDING ON-CHIP CLOCK CONTROLLER AND MOBILE DEVICE HAVING THE SAME

(71) Applicant: Minsu Kim, Hwaseong-si (KR)

(72) Inventor: Minsu Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/968,894

(22) Filed: Dec. 15, 2015

(65) Prior Publication Data

US 2016/0179074 A1  Jun. 23, 2016

(30) Foreign Application Priority Data

Dec. 22, 2014  (KR) .................. 10-2014-0186397

(51) Int. Cl.
*G01R 31/317* (2006.01)
*G05B 19/045* (2006.01)
*H03K 3/356* (2006.01)
*G01R 31/3185* (2006.01)
*H03K 3/012* (2006.01)

(52) U.S. Cl.
CPC ... *G05B 19/045* (2013.01); *G01R 31/318541* (2013.01); *G01R 31/318552* (2013.01); *H03K 3/356* (2013.01); *H03K 3/356104* (2013.01); *H03K 3/012* (2013.01); *H03K 3/356008* (2013.01)

(58) Field of Classification Search
CPC .... G01R 31/318541; G01R 31/318552; G05B 19/045; H03K 3/012; H03K 3/356; H03K 3/356008; H03K 3/356104
See application file for complete search history.

(56) References Cited

U.S. PATENT DOCUMENTS

| | | | | |
|---|---|---|---|---|
| 4,864,579 A | * | 9/1989 | Kishida | G01R 31/318541 714/726 |
| 5,457,698 A | * | 10/1995 | Segawa | G01R 31/318541 714/731 |
| 5,784,384 A | * | 7/1998 | Maeno | G11C 11/41 714/726 |
| 6,242,958 B1 | * | 6/2001 | Fletcher | H03K 3/35625 327/201 |
| 6,703,881 B2 | | 3/2004 | Lu | |
| 7,418,641 B2 | * | 8/2008 | Drake | G06F 11/1666 714/726 |
| 7,590,900 B2 | | 9/2009 | Kim et al. | |
| 7,650,549 B2 | * | 1/2010 | Branch | G01R 31/318552 714/724 |
| 7,747,917 B2 | * | 6/2010 | Putman | G01R 31/318594 327/202 |

(Continued)

FOREIGN PATENT DOCUMENTS

JP  2004-080172  3/2004

*Primary Examiner* — Alexander H Taningco
*Assistant Examiner* — Kurtis R Bahr
(74) *Attorney, Agent, or Firm* — Volentine & Whitt, PLLC

(57) ABSTRACT

A system-on-chip (SoC) includes a logic circuit having a scan flip-flop and a an on-chip clock controller. The scan flip-flop is configured to store data using a passive keeper. The on-chip clock controller is configured to receive a reference clock for driving the logic circuit, to generate an internal clock based on a high-state interval of the reference clock, and to provide the internal clock to the scan flip-flop.

20 Claims, 15 Drawing Sheets

(56) References Cited

U.S. PATENT DOCUMENTS

| | | | | |
|---|---|---|---|---|
| 7,917,821 B2* | 3/2011 | Lee | ............... | G01R 31/318544 |
| | | | | 714/30 |
| 8,037,385 B2* | 10/2011 | Rachapalli | ..... | G01R 31/318552 |
| | | | | 324/750.3 |
| 8,624,632 B2* | 1/2014 | Bulzacchelli | .... | H03K 3/356139 |
| | | | | 327/212 |
| 9,438,206 B2* | 9/2016 | Maehashi | .............. | H03K 3/012 |
| 2004/0019830 A1* | 1/2004 | Hosotani | ........ | G01R 31/318541 |
| | | | | 714/30 |
| 2005/0039096 A1* | 2/2005 | Guettaf | ................... | H04N 5/46 |
| | | | | 714/726 |

\* cited by examiner

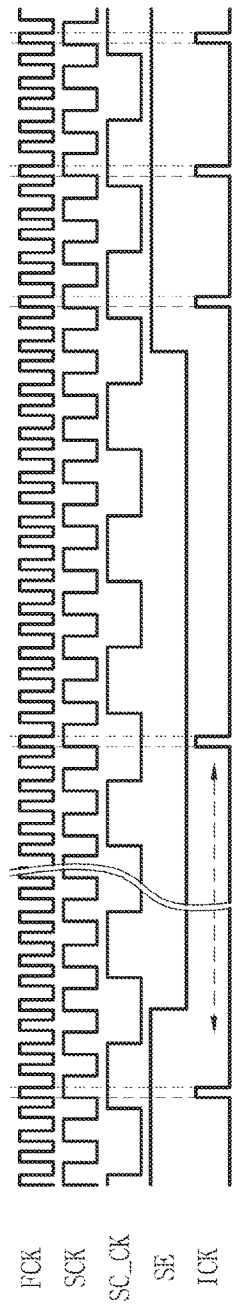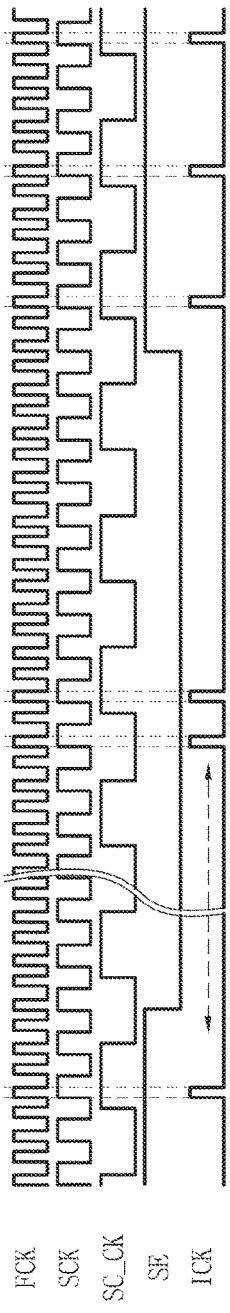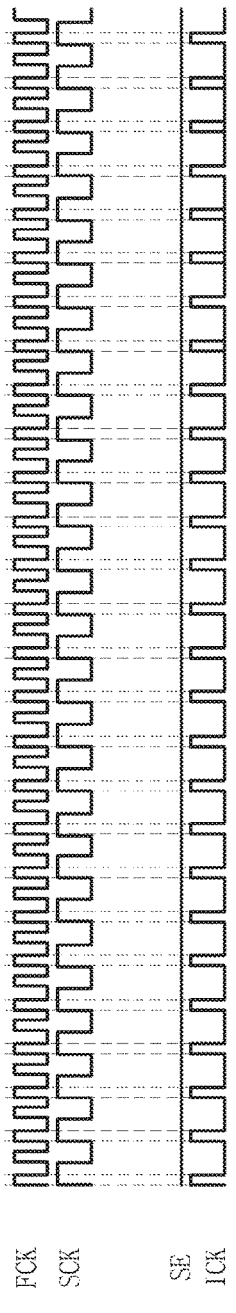

SYSTEM-ON-CHIP INCLUDING ON-CHIP CLOCK CONTROLLER AND MOBILE DEVICE HAVING THE SAME

CROSS-REFERENCE TO RELATED APPLICATION

A claim for priority under 35 U.S.C. § 119 is made to Korean Patent Application No. 10-2014-0186397 filed on Dec. 22, 2014, in the Korean Intellectual Property Office, the entire contents of which are hereby incorporated by reference.

BACKGROUND

Embodiments of the inventive concept relate to a system-on-chip (SoC), and more particularly, to an SoC that includes an on-chip clock controller for controlling a duty cycle of an internal clock to drive a scan flip-flop using a passive keeper and a mobile device having the same.

With growing competition in the mobile device market, demands on mobile devices to have low-prices, low-power consumption, and high performance are rapidly increasing. To satisfy these demands, design overhead for a system-on-chip (SoC) needs to be reduced or removed.

An example of typical design overhead is test costs. However, when an SoC is not tested, more costs with respect to reliability verification of mass production may be needed. Accordingly, testing should be considered in designing the SoC.

SUMMARY

Embodiments of the inventive concept provide a system-on-chip (SoC) having low-power consumption and high-performance. Other embodiments of the inventive concept provide a mobile device having the SoC.

The technical objectives of the inventive concept are not limited to the above disclosure; other objectives may become apparent to those of ordinary skill in the art based on the following descriptions.

In accordance with an aspect of the inventive concept, an SoC includes a logic circuit, and the logic circuit includes a scan flip-flop and an on-chip clock controller. The scan flip-flop is configured to store data using a passive keeper. The on-chip clock controller is configured to receive a reference clock for driving the logic circuit, to generate an internal clock based on a high-state interval of the reference clock, and to provide the internal clock to the scan flip-flop.

The on-chip clock controller may control a high-state interval of the internal clock to be equal to the high-state interval of the reference clock.

The logic circuit may further include at least one intellectual property (IP), and the scan flip-flop may form a scan chain and receive scan data through the scan chain while a scan test is performed to detect a fault in the at least one IP. The scan flip-flop may perform a normal operation for a clock to detect the fault in the at least one IP. The scan flip-flop may perform a normal operation for two clocks to check a normal operation speed of the at least one IP.

The scan flip-flop may include a multiplexer configured to output one of scan data and normal data in synchronization with the internal clock in response to a scan enable signal; a first latch configured to store one of the scan data and the normal data using the passive keeper; and a second latch configured to store data transmitted from the first latch using an active keeper.

The active keeper may include a back-to-back inverter. The first latch may include a first element configured to pass data in synchronization with the internal clock; and a second element configured to store the data transmitted from the first element using the passive keeper. The internal clock may have a return-to-zero form.

The scan flip-flop may include a multiplexer configured to output one of scan data and normal data in synchronization with the internal clock in response to a scan enable signal; a first latch configured to store one of the scan data and the normal data using an active keeper; and a second latch configured to store data transmitted from the first latch using the passive keeper. The internal clock may have a return-to-high form.

The logic circuit may further include a flip-flop configured to store data using the passive keeper.

In accordance with another aspect of the inventive concept, an SoC includes a logic circuit, and the logic circuit includes a flip-flop and an on-chip clock controller. The flip-flop is configured to store data using a passive keeper. The on-chip clock controller is configured to receive a reference clock for driving the logic circuit, to generate an internal clock based on a high-state interval of the reference clock, and to provide the internal clock to the flip-flop.

The on-chip clock controller may control a high-state interval of the internal clock to be equal to the high-state interval of the reference clock.

The flip-flop may include a first latch configured to store data using the passive keeper; and a second latch configured to store the data transmitted from the first latch using an active keeper.

The first latch may include a first element configured to pass data in synchronization with the internal clock; and a second element configured to store the data transmitted from the first element using the passive keeper. The internal clock may have a return-to-zero form. The active keeper may include a back-to-back inverter.

The flip-flop may include a first latch configured to store data using an active keeper; and a second latch configured to store the data transmitted from the first latch using the passive keeper. The internal clock may have a return-to-high form.

The logic circuit may further include a scan flip-flop configured to store data using the passive keeper.

In accordance with another aspect of the inventive concept, an SoC includes a logic circuit, and the logic circuit includes a clock gate and an on-chip clock controller. The clock gate is configured to store data using a passive keeper. The on-chip clock controller is configured to receive a reference clock for driving the logic circuit, to generate an internal clock based on a high-state interval of the reference clock, and to provide the internal clock to the clock gate.

The on-chip clock controller may control a high-state interval of the internal clock to be equal to the high-state interval of the reference clock.

The clock gate may include a latch configured to store one of a clock enable signal and a scan enable signal using the passive keeper; and an AND gate configured to perform an AND operation with respect to the stored signal and the internal clock. The latch may include a first element configured to pass data in synchronization with the internal clock; and a second element configured to store the data transmitted from the first element using the passive keeper.

The logic circuit may further include a flip-flop configured to store data using the passive keeper and a scan flip-flop configured to store data using the passive keeper.

In accordance with another aspect of the inventive concept, a mobile device includes an application processor having at least one logic circuit, and the logic circuit includes a scan flip-flop and an on-chip clock controller. The scan flip-flop is configured to store data using a passive keeper. The on-chip clock controller is configured to receive a reference clock for driving the logic circuit, to generate an internal clock based on a high-state interval of the reference clock, and to provide the internal clock to the scan flip-flop.

The on-chip clock controller may control a high-state interval of the internal clock to be equal to the high-state interval of the reference clock.

The logic circuit may further include at least one intellectual property (IP), and the scan flip-flop may form a scan chain and receive a scan test pattern through the scan chain while a scan test operation is performed to detect a fault in the IP. The scan flip-flop may perform a normal operation for a clock to detect the fault in the IP. The scan flip-flop may perform a normal operation for two clocks to check a normal operation speed of the IP.

The scan flip-flop may include a multiplexer configured to output one of scan data and normal data in synchronization with the internal clock in response to a scan enable signal; a first latch configured to store one of the scan data and the normal data using the passive keeper; and a second latch configured to store data transmitted from the first latch using an active keeper.

The active keeper may include a back-to-back inverter. The first latch may include a first element configured to pass data in synchronization with the internal clock; and a second element configured to store the data transmitted from the first element using the passive keeper. The internal clock may have a return-to-zero form.

The scan flip-flop may include a multiplexer configured to output one of scan data and normal data in synchronization with the internal clock in response to a scan enable signal; a first latch configured to store one of the scan data and the normal data using an active keeper; and a second latch configured to store data transmitted from the first latch using the passive keeper. The internal clock may have a return-to-high form.

In accordance with another aspect of the inventive concept, a synchronous system includes a combinational circuit having at least one logic circuit, a normal flip-flop, a scan flip-flop and a clock gate. The normal flip-flop is configured to store a data input signal in response to a clock enable signal E, and to transmit the stored data input signal to the combinational circuit. The scan flip-flop is configured to store the data input signal or a scan input signal in response to a scan enable signal SE, and to transmit the stored data input signal or the stored scan input signal to the combinational circuit. The scan flip-flop includes a multiplexer configured to select one of the data input signal and the scan input signal in response to the scan enable signal SE, a master latch configured to receive and store the one of the data input signal the scan input signal output from the scan multiplexer under control of an enable clock ECK, and a slave latch configured to receive and store the stored one of the data input signal D and the scan input signal SI output from the master latch in response to the enable clock ECK. The clock gate is configured to generate the enable clock ECK in synchronization with a clock signal CK, to supply the enable clock ECK to the normal flip-flop when the clock enable signal E is activated and to supply the enable clock ECK to the scan flip-flop when the scan enable signal SE is activated.

The clock gate may include a pulse latch and an AND gate, where the pulse latch may store data using an active keeper.

The scan flip-flop may be configured to store the data input signal or the scan input signal data using a passive keeper.

When the scan enable signal SE is activated, the master latch may transmit the received data to the slave latch when the clock signal CK is in a low state, and the slave latch may output the stored data when the clock signal CK is in a high state.

BRIEF DESCRIPTION OF THE DRAWINGS

Exemplary embodiments of the inventive concept will be more clearly understood from the following description taken in conjunction with the accompanying drawings, in which like reference characters refer to the same parts throughout the different views. The drawings are not necessarily to scale, emphasis instead being placed upon illustrating the principles of the inventive concepts. In the drawings:

FIG. 7A is a timing diagram for describing an operation of a scan test which detects a fault of the logic circuit when there is a slow clock;

FIG. 7B is a timing diagram for describing an operation of a scan test which verifies a normal operation of the logic circuit when there is a slow clock;

FIG. 7C is a timing diagram for describing a normal operation of the logic circuit shown in FIG. 6 when there is a slow clock;

DETAILED DESCRIPTION OF THE EMBODIMENTS

Figure 1:
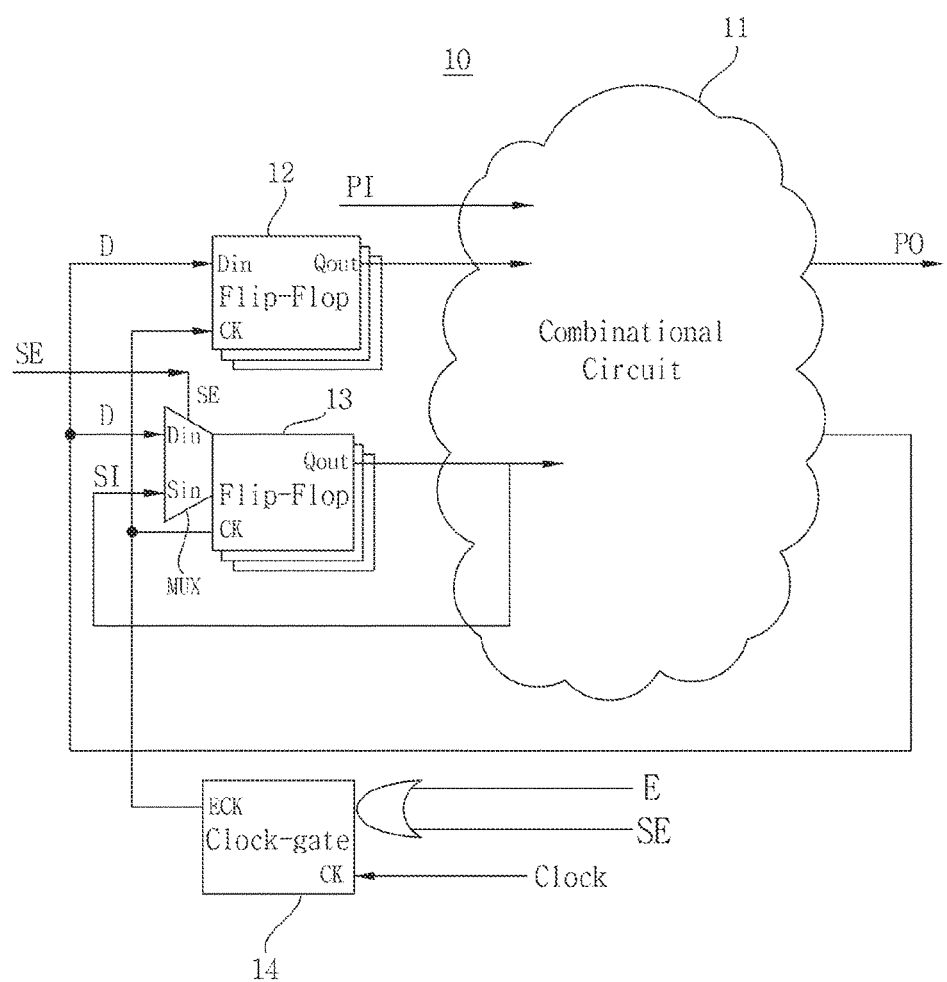
FIG. 1 is a block diagram illustrating a synchronous system, according to an embodiment of the inventive concept.

Specific structural and functional details disclosed herein are merely representative for purposes of describing exemplary embodiments of the inventive concept. That is, embodiments will be described in detail with reference to the following description and accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to one of ordinary skill in the art. Known processes, elements, and techniques are not described with respect to some of the embodiments.

While the inventive concept is susceptible to various modifications and alternative forms, specific embodiments thereof are shown by way of example in the drawings and will herein be described in detail. It should be understood, however, that there is no intent to limit the embodiments to the particular forms disclosed, but on the contrary, the inventive concept is to cover all modifications, equivalents, and alternatives falling within the spirit and scope of the inventive concept.

It will be understood that, although the terms first, second, A, B, etc., may be used herein in reference to elements of the invention, such elements should not be construed as limited by these terms. For example, a first element could be termed a second element, and a second element could be termed a first element, without departing from the scope of the present teachings. Herein, the term "and/or" includes any and all combinations of one or more referents. The term "exemplary" is intended to refer to an example or illustration.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

The terminology used herein to describe embodiments of the invention is not intended to limit the scope of the invention. The articles "a," "an," and "the" are singular in that they have a single referent, however the use of the singular form in the present document should not preclude the presence of more than one referent. In other words, elements of the invention referred to in singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

Meanwhile, when it is possible to implement any embodiment in any other way, a function or an operation specified in a specific block may be performed differently from a flow specified in a flowchart. For example, consecutive two blocks may actually perform the function or the operation simultaneously, and the two blocks may perform the function or the operation conversely according to a related operation or function.

Embodiments of the present inventive concept will be described below with reference to attached drawings.

FIG. 1 is a block diagram illustrating a synchronous system, according to an embodiment of the inventive concept.

Referring to FIG. 1, the synchronous system 10 includes a combinational circuit and a storage element. In an embodiment, the storage element may include a latch or a flip-flop.

In the depicted embodiment, the synchronous system 10 includes a combinational circuit 11, a plurality of normal flip-flops 12, a plurality of scan flip-flops 13, and a clock gate 14.

The combinational circuit 11 may include an AND gate, a NAND gate, an OR gate, a NOR gate, an XOR gate, an XNOR gate, a buffer, and an inverter. More particularly, the combinational circuit 11 may include a combination of an AND gate, a NAND gate, an OR gate, a NOR gate, an XOR gate, an XNOR gate, a buffer, and an inverter without including a latch circuit or a register such as a flip-flop.

Each of the normal flip-flops 12 may include two latches connected in series. For example, each of the normal flip-flops 12 may include a master latch and a slave latch. Each of the flip-flops 12 may transmit a data input signal D to the combinational circuit 11.

Each of the scan flip-flops 13 may include a multiplexer (MUX) connected to the input and two latches connected in series. For example, each of the scan flip-flops 13 may include a structure where the MUX, the master latch, and the slave latch are connected in series. Here, the master latch is a first latch and the slave latch is a second latch.

In response to a scan enable signal SE, the MUX may receive a scan input signal SI or a data input signal D. Each of the scan flip-flops 13 may transmit received data to the combinational circuit 11. Examples of the scan flip-flop are described below with reference to FIGS. 3A to 3D, in detail.

The combinational circuit 11 receives primary input data PI and data transmitted from each of the normal flip-flops 12 and the scan flip-flops 13. The combinational circuit 11 outputs primary output data PO. The combinational circuit 11 also transmits an output of the combinational circuit 11 to at least one of the normal flip-flops 12 and the scan flip-flops 13.

In response to a clock enable signal E and the scan enable signal SE, the clock gate 14 generates an enable clock ECK. The clock gate 14 transmits the enable clock ECK to the normal flip-flops 12 or the scan flip-flops 13. Examples of the clock gate 14 are described below with reference to FIG. 4A to 4C, in detail.

The synchronous system 10 may be tested using a scan test operation. During the scan test operation, the scan flip-flops 13 may be transformed into a scan chain. For example, the scan flip-flops 13 may form the scan chain using the respective multiplexer MUX.

During the scan test operation, the scan flip-flops may receive scan data SI through the multiplexer MUX. That is, the scan data SI may be transmitted to each of the scan flip-flops 13 using a serial shift method, for example.

During the scan test operation, the synchronous system 10 may perform a normal operation for a clock or two clocks. Moreover, a result where the normal operation is performed may be outputted using the scan chain. For example, to detect a fault of the synchronous system 10, the synchronous system 10 may perform a normal operation for a clock in a scan test operation. Moreover, to verify a normal operation speed of the synchronous system 10, the synchronous system 10 may perform the normal operation for two clocks in a scan test operation.

In an embodiment, the synchronous system 10 may include an intellectual property (IP). IP denotes a specific functional block in which a verification is complete in a process to manufacture another chip. Accordingly, because the verification is complete, the verification procedure about a specific functional block is omitted. For example, when there is a need to use a functional block, an IP (i.e., the functional block) in which a verification is previously complete is used as well as the functional block is newly designed. Moreover, the IP may be implemented using a system-on-chip (SoC).

Figure 2A:
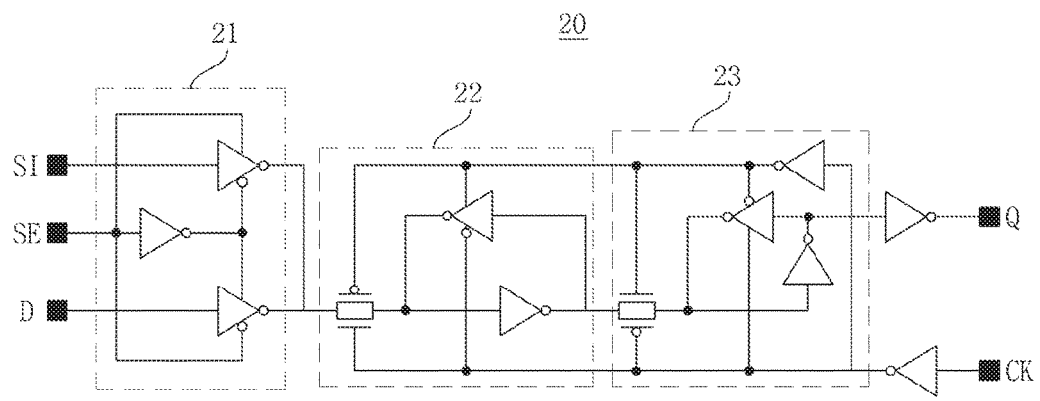
FIG. 2A is a circuit diagram illustrating a scan flip-flop in detail, according to related art.

FIG. 2A is a circuit diagram illustrating an example of a scan flip-flop, according to related art, in detail.

Referring to FIG. 2A, the scan flip-flop 20 includes a scan multiplexer 21, a master latch 22, and a slave latch 23. For example, the scan flip-flop 20 includes a structure in which the scan multiplexer 21, the master latch 22, and the slave latch 23 are continuously connected. The master latch 22 may be referred to as a first latch, and the slave latch 23 may be referred to as a second latch.

In response to a scan enable signal SE, the scan multiplexer 21 may output one of a scan input signal SI and a data input signal D. For example, the scan multiplexer 21 may include a general multiplexer.

Each of the master latch 22 and the slave latch 23 may store data using an active keeper. An active keeper stores data when power is supplied. In an embodiment, the active keeper may include a back-to-back inverter (or cross-coupled inverter) for storing data during one cycle of a clock. For example, each of the master latch 22 and the slave latch 23 may store data using an active keeper, thus storing the data when power is supplied.

In comparison, a passive keeper may store data using a parasite capacitor or a passive capacitor. That is, the passive keeper stores data regardless of power supply. However, the passive keeper stores data during a very short time using the passive capacitor instead of back-to-back invertors, for example. That is, when the embodiment operates at about 500 MHz or more, for example, a very short time is about 2 ns or less. In various embodiments, one or both of the master latch 22 and the slave latch 23 may store data using a passive keeper. In this case, the master latch 22 (i.e., the first latch) or the slave latch 23 (i.e., the second latch) that stores data using the passive keeper stores data for a very short time, regardless of power supply.

In synchronization with a clock signal CK, the master latch 22 receives one of the scan input signal SI and the data input signal D from the scan multiplexer 21. For example, when the clock signal CK is in a high state, the master latch 22 receives one of the scan input signal SI and the data input signal D from the scan multiplexer 21 and stores the received data. When the clock signal CK is in a low state, the master latch 22 transmits the received data to the slave latch 23. The slave latch 23 stores the received data. When the clock signal CK is in a high state, the slave latch 23 outputs the stored data. That is, an output Q of the scan flip-flop is an output of the slave latch 23.

Figure 2B:
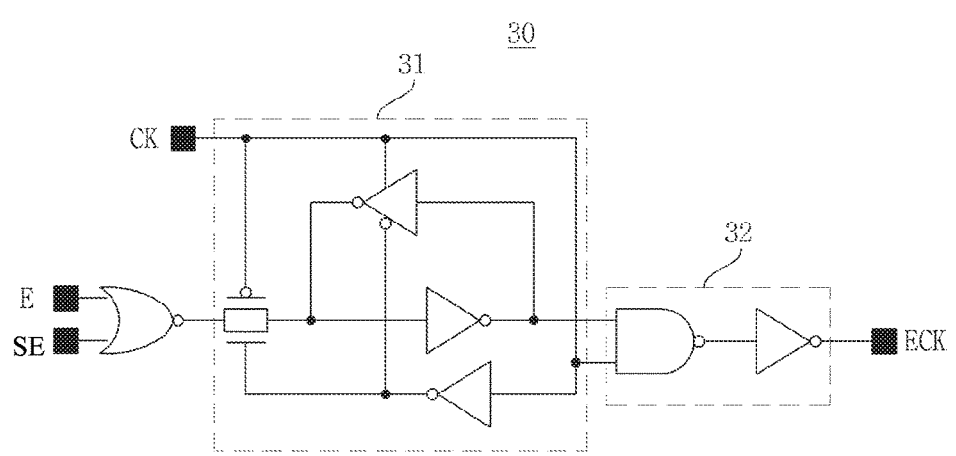
FIG. 2B is a circuit diagram illustrating a clock gate circuit in detail, according to related art.

FIG. 2B is a circuit diagram illustrating an example of a clock gate, according to a related art, in detail.

Referring to FIGS. 1 and 2B, a clock gate 30 supplies a clock signal to the normal flip-flops 12 and the scan flip-flops 13.

The clock gate 30 includes a pulse latch 31 and an AND gate 32. The pulse latch 31 may store data using an active keeper. For example, the pulse latch 31 may include a transmission gate, a tri-state buffer, and two inverters.

When at least one of a clock enable signal E and a scan enable signal SE is activated, the clock gate 30 outputs an enable clock ECK in synchronization with a clock signal CK.

Generally, the clock gate 30 stores data using an active keeper. For example, the active keeper may include a back-to-back inverter. The clock gate 30 may store at least one activated signal of the clock enable signal E and the scan enable signal SE using the active keeper.

Figure 3A:
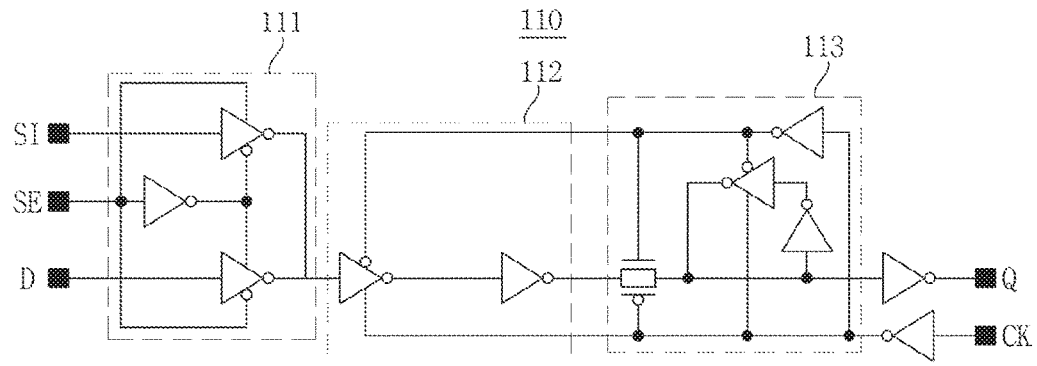
FIG. 3A is a circuit diagram illustrating a scan flip-flop, according to an embodiment of the inventive concept.

FIG. 3A is a circuit diagram illustrating a scan flip-flop, according to an embodiment of the inventive concept.

Referring to FIG. 3A, the scan flip-flop 110 includes a scan multiplexer 111, a master latch 112, and a slave latch 113.

The scan multiplexer 111 may include the same structure as the scan multiplexer 21 discussed above with reference to FIG. 2A. For example, the scan multiplexer 111 may include two tri-state buffers and an inverter.

In response to a scan enable signal SE, the scan multiplexer 111 may output any one of a scan input signal SI and a data input signal D. For example, the scan multiplexer 111 may include a general multiplexer.

The master latch 112 may store data using a passive keeper. In the depicted example, the master latch 112 includes a tri-state buffer and an inverter. In an embodiment, the passive keeper may include a parasitic capacitor. Moreover, a parasitic capacitor may exist in a node between the tri-state buffer and the inverter. The master latch 112 may store data for very short time using the parasitic capacitor.

The slave latch 113 may store data using an active keeper. In the depicted example, the slave latch 113 includes a transmission gate, a tri-state buffer, and two inverters. A tri-state buffer and an inverter in the slave latch 113 may be implemented using a back-to-back inverter.

In synchronization with a clock signal CK, the master latch 112 receives one of the scan input signal SI and the data input signal D from the scan multiplexer 111. For example, when the clock signal CK is in a high state, the master latch 112 receives one of the scan input signal SI and the data input signal D from the scan multiplexer 111 and stores the received data. When the clock signal CK is in a low state, the master latch 112 transmits the received data to the slave latch 113. The slave latch 113 stores the received data. When the clock signal CK is in a high state, the slave latch 113 outputs the stored data. That is, an output Q of the scan flip-flop 110 is an output of the slave latch 113.

Because the master latch 112 uses a passive keeper, the scan flip-flop 110 may only be operated using a clock having a high frequency. However, the scan test operation may only be operated using a clock having a low frequency. Accordingly, to operate the scan flip-flop 110 according to the embodiment of the inventive concept, the scan flip-flop 110 receives a clock where a duty cycle of the clock is adjusted. An example of timing for adjusting the duty cycle of the clock is described below with reference to FIGS. 7A to 8C.

Figure 3B:
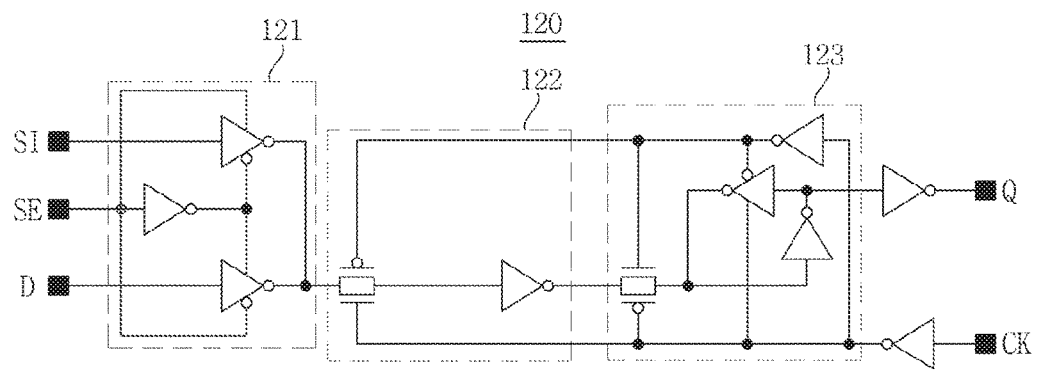
FIG. 3B is a circuit diagram illustrating a scan flip-flop, according to another embodiment of the inventive concept.

FIG. 3B is a circuit diagram illustrating a scan flip-flop, according to another embodiment of the inventive concept.

Referring to FIG. 3B, the scan flip-flop 120 includes a scan multiplexer 121, a master latch 122, and a slave latch 123.

The scan multiplexer 121 may include the same structure as the scan multiplexer 21 shown in FIG. 2A. In the depicted example, the scan multiplexer 121 includes two tri-state buffers and an inverter.

In response to a scan enable signal SE, the scan multiplexer 121 may output one of a scan input signal SI and a data input signal D. In the depicted example, the scan multiplexer 121 includes a general multiplexer.

The master latch 122 may store data using a passive keeper. In the depicted example, the master latch 122 includes a transmission gate and an inverter. In an embodiment, the passive keeper may include a parasitic capacitor. Moreover, a parasitic capacitor may exist in a node between the transmission gate and the inverter. The master latch 122 may store data for a very short time using the parasitic capacitor.

The slave latch 123 may store data using an active keeper. In the depicted example, the slave latch 123 includes a transmission gate, a tri-state buffer, and two inverters. A tri-state buffer and an inverter in the slave latch 123 may be implemented using a back-to-back inverter.

In synchronization with a clock signal CK, the master latch 122 receives one of the scan input signal SI and the data input signal D from the scan multiplexer 121.

For example, when the clock signal CK is in a high state, the master latch 122 receives one of the scan input signal SI and the data input signal D from the scan multiplexer 121 and stores the received data. When the clock signal CK is in a low state, the master latch 122 transmits the received data to the slave latch 123. The slave latch 123 stores the received data. When the clock signal CK is in a high state, the slave latch 123 outputs the stored data. That is, an output Q of the scan flip-flop 120 is an output of the slave latch 123.

Figure 3C:
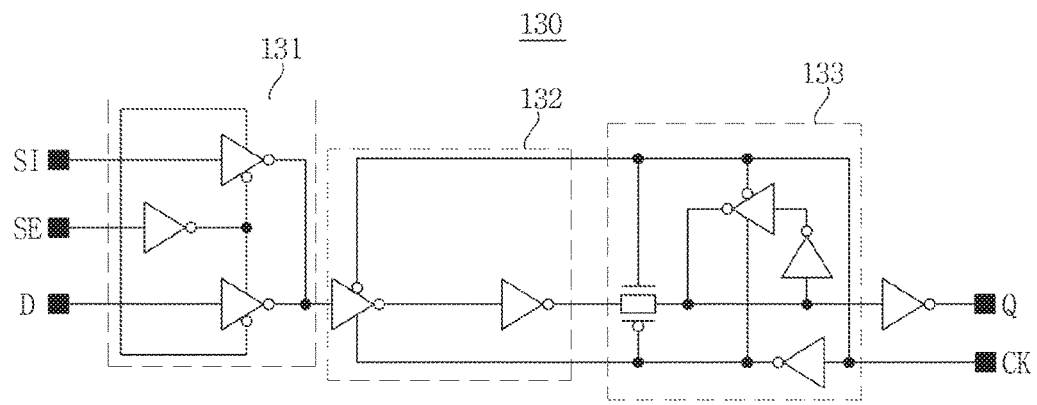
FIG. 3C is a circuit diagram illustrating a scan flip-flop, according to still another embodiment of the inventive concept.

FIG. 3C is a circuit diagram illustrating a scan flip-flop, according to still another embodiment of the inventive concept.

Referring to FIG. 3C, the scan flip-flop 130 includes a scan multiplexer 131, a master latch 132, and a slave latch 133.

The scan multiplexer 131 may include the same structure as the scan multiplexer 21 shown in FIG. 2A. For example, the scan multiplexer 131 may include two tri-state buffers and an inverter.

In response to a scan enable signal SE, the scan multiplexer 131 may output one of a scan input signal SI and a data input signal D. For example, the scan multiplexer 131 may include a general multiplexer.

The master latch 132 may store data using a passive keeper. In the depicted example, the master latch 132 includes a tri-state buffer and an inverter. In an embodiment, the passive keeper may include a parasitic capacitor. Moreover, a parasitic capacitor may exist in a node between the tri-state buffer and the inverter. The master latch 132 may store data for a very short time using the parasitic capacitor.

The slave latch 133 may store data using an active keeper. In the depicted example, the slave latch 133 includes a transmission gate, a tri-state buffer, and two inverters. A tri-state buffer and an inverter in the slave latch 133 may be implemented using a back-to-back inverter. The location of one of the two inverters in the slave latch 133 is different from the location of the corresponding inverter shown in FIGS. 3A and 3B.

In synchronization with a clock signal CK, the master latch 132 receives one of the scan input signal SI and the data input signal D from the scan multiplexer 131.

For example, when the clock signal CK is in a low state, the master latch 132 receives one of the scan input signal SI and the data input signal D from the scan multiplexer 131 and stores the received data. When the clock signal CK is in a high state, the master latch 132 transmits the received data to the slave latch 133. The slave latch 133 stores the received data. When the clock signal CK is in a high state, the slave latch 133 outputs the stored data. That is, an output Q of the scan flip-flop 130 is an output of the slave latch 133.

Figure 3D:
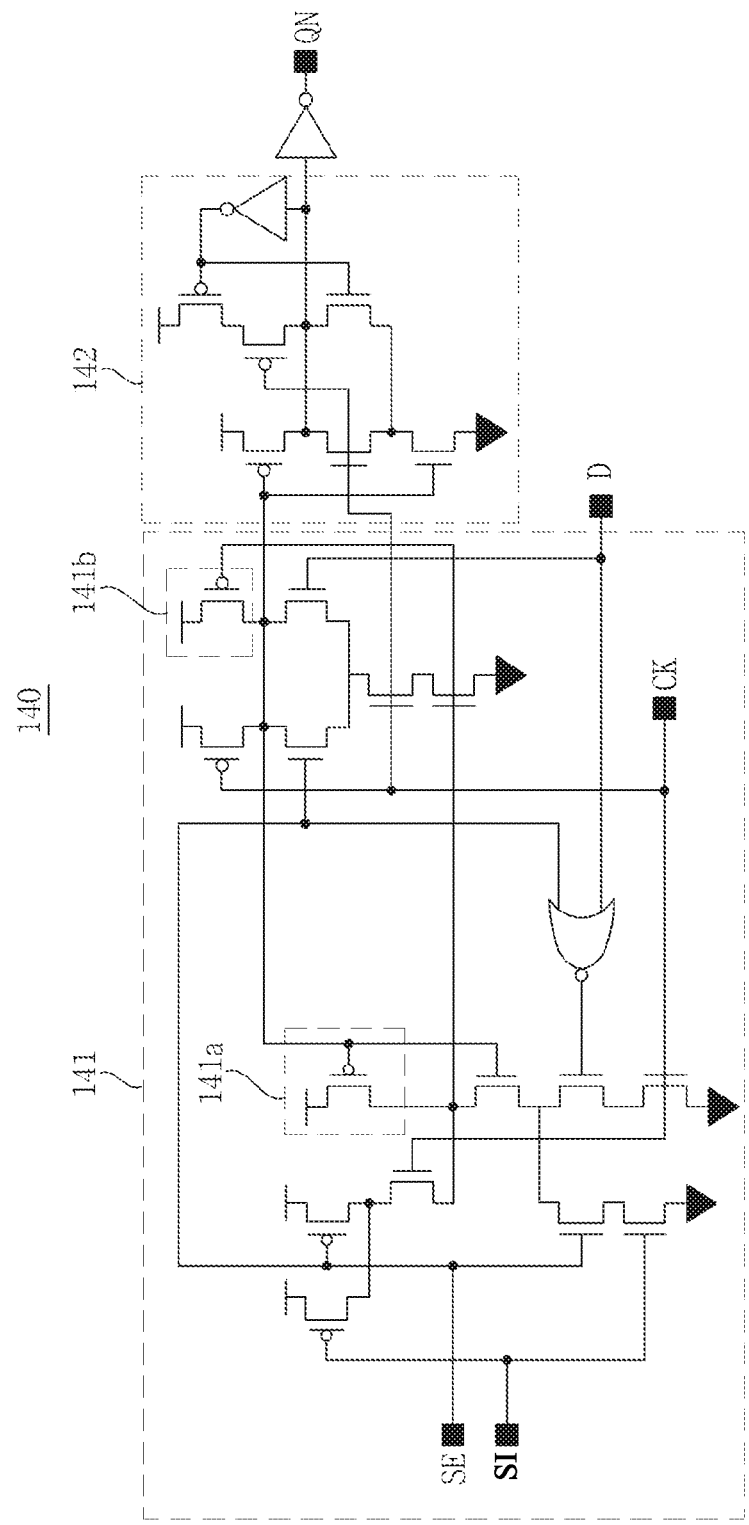
FIG. 3D is a circuit diagram illustrating a scan flip-flop, according to yet another embodiment of the inventive concept.

FIG. 3D is a circuit diagram illustrating a scan flip-flop, according to yet another embodiment of the inventive concept.

Referring to FIG. 3D, the scan flip-flop 140 includes a master latch 141 including a multiplexer and a slave latch 142.

The master latch 141 may store data using a passive keeper. In the depicted example, the master latch 141 include five PMOS transistors, ten NMOS transistors, and a NOR gate.

The slave latch 142 may store data using an active keeper. In the depicted example, the slave latch 142 includes three PMOS transistors, three NMOS transistors, and an inverter.

In response to a scan enable signal SE, the master latch 141 receives one of the scan input signal SI and the data input signal D in synchronization with a clock signal CK.

For example, when the clock signal CK is in a high state, the master latch 141 receives one of the scan input signal SI and the data input signal D and stores the received data. When the clock signal CK is in a low state, the master latch 141 transmits the received data to the slave latch 142. The slave latch 142 stores the received data. When the clock signal CK is in a high state, the slave latch 142 outputs the stored data. That is, an output QN of the scan flip-flop 140 is an inverted output of the slave latch 142.

Notably, the scan flip-flop 140 may theoretically operate with a first PMOS transistor 141*a* and a second PMOS transistor 141*b* excluded from the circuit. However, the first PMOS transistor 141*a* and the second PMOS transistor 141*b* may be included the scan flip-flop 140 (as shown in FIG. 3D) so that the scan flip-flop 140 may be stably operated.

Figure 4A:
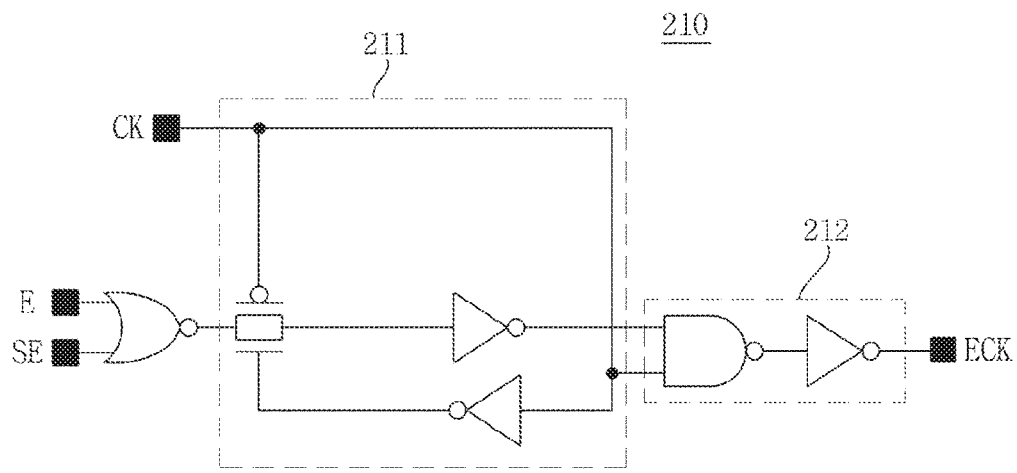
FIG. 4A is a circuit diagram illustrating a clock gate, according to an embodiment of the inventive concept.

FIG. 4A is a circuit diagram illustrating a clock gate, according to an embodiment of the inventive concept.

Referring to FIGS. 1 and 4A, the clock gate 210 includes a pulse latch 211 and an AND gate 212.

The pulse latch 211 may include the same structure as the master latches 112, 122, and 132 shown in FIGS. 3A to 3C, for example. The pulse latch 211 may store data using a passive keeper. For example, the pulse latch 211 shown in FIG. 4A includes a transmission gate and two inverters.

The pulse latch 211 may store any one of a clock enable signal E and a scan enable signal SE in synchronization with a clock signal CK. The pulse latch 211 may transmit any one of the clock enable signal E and the scan enable signal SE to the AND gate 212.

The AND gate 212 performs an AND operation with respect to the clock signal CK and data stored in the pulse latch 211. The AND gate 212 outputs the operated result as an enable clock ECK. In an embodiment, the AND gate 212 may be implemented with a NAND gate and an inverter.

Because the pulse latch 211 uses a passive keeper, the clock gate 210 may only be operated in a clock having a high frequency. However, the scan operation may only be operated in a clock having a low frequency. Accordingly, to operate the clock gate 210 according to the embodiment of the inventive concept, the clock gate 210 may receive a clock where a duty cycle of a clock is adjusted.

Figure 4B:
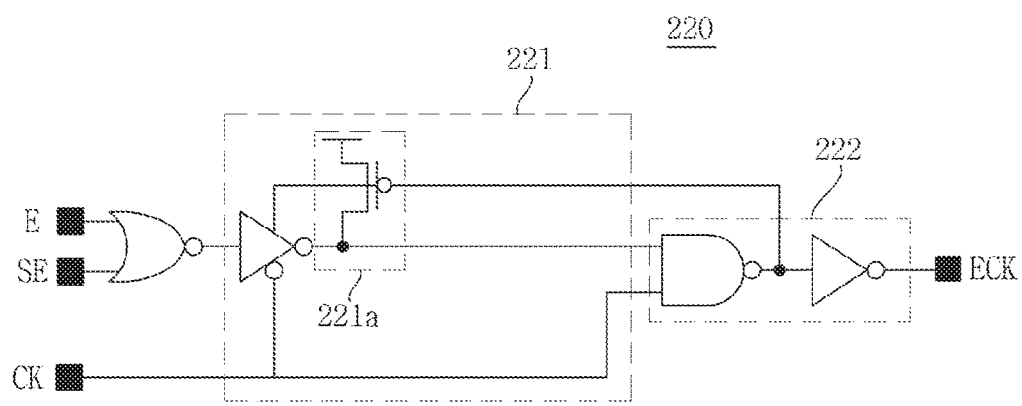
FIG. 4B is a circuit diagram illustrating a clock gate, according to another embodiment of the inventive concept.

FIG. 4B is a circuit diagram illustrating a clock gate according to another embodiment of the inventive concept.

Referring to FIGS. 1 and 4B, the clock gate 220 according to another embodiment of the inventive concept includes a pulse latch 221 and an AND gate 222.

The pulse latch 221 may include the same structure as the master latches 112, 122, and 132 shown in FIGS. 3A to 3C. The pulse latch 221 may store data using a passive keeper. For example, the pulse latch 221 shown in FIG. 4B includes a tri-state buffer.

The pulse latch 221 may store any one of a clock enable signal E and a scan enable signal SE in synchronization with a clock signal CK. The pulse latch 221 may transmit any one of the clock enable signal E and the scan enable signal SE to the AND gate 222.

The AND gate 222 may perform an AND operation with respect to the clock signal CK and data stored in the pulse latch 221. The AND gate 222 may output the operated result as an enable clock ECK. In an embodiment, the AND gate 222 may be implemented with a NAND gate and an inverter.

Even if the PMOS transistor 221a were excluded, the clock gate 220 may be theoretically operated. However, the pulse latch 211 may include the PMOS transistor 221a so that the clock gate 220 is stably operated.

Figure 4C:
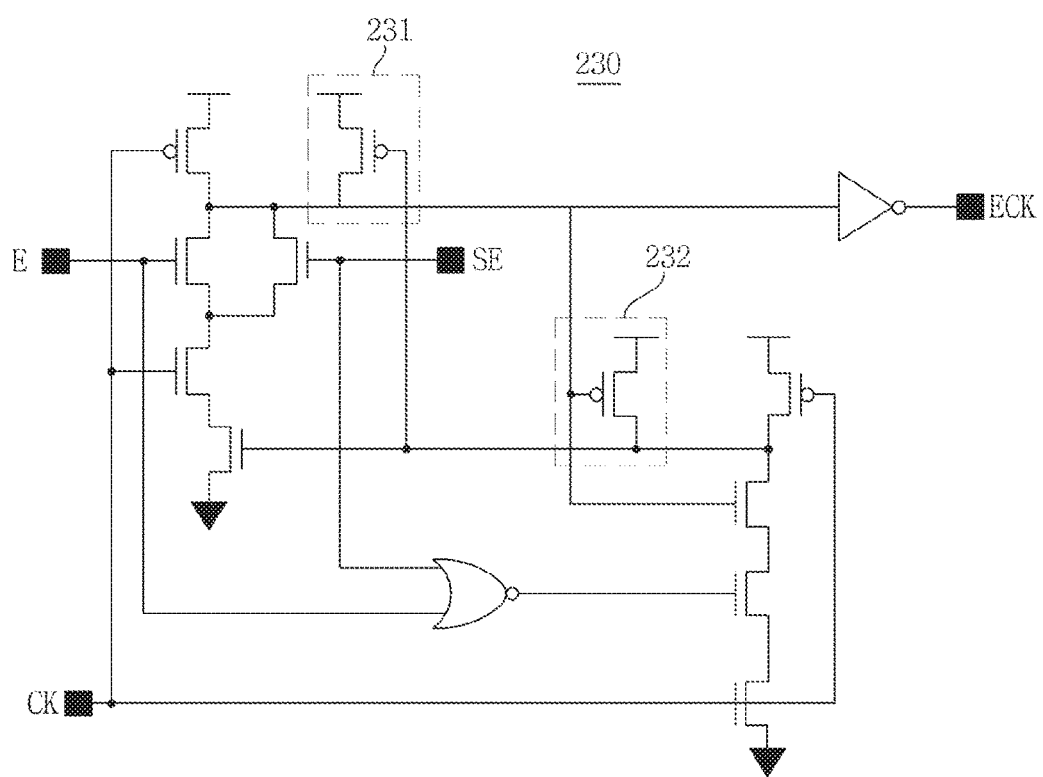
FIG. 4C is a circuit diagram illustrating a clock gate, according to still another embodiment of the inventive concept.

FIG. 4C is a circuit diagram illustrating a clock gate according to still another embodiment of the inventive concept.

Referring to FIGS. 1 and 4C, the clock gate 230 includes a pulse latch for storing data using a passive keeper. For example, the clock gate 230 may include four PMOS transistors, seven NMOS transistors, a NOR gate, and an inverter.

The clock gate 230 may store any one of a clock enable signal E and a scan enable signal SE in synchronization with a clock signal CK. The clock gate 230 may output any one of the clock enable signal E and the scan enable signal SE in synchronization with the enable clock ECK.

Even if a first PMOS transistor 231 and a second PMOS transistor 232 were excluded, the clock gate 230 may be theoretically operated. However, the clock gate 230 may include the first PMOS transistor 231 and the second PMOS transistor 232 so that the clock gate 230 is stably operated.

Figure 5:
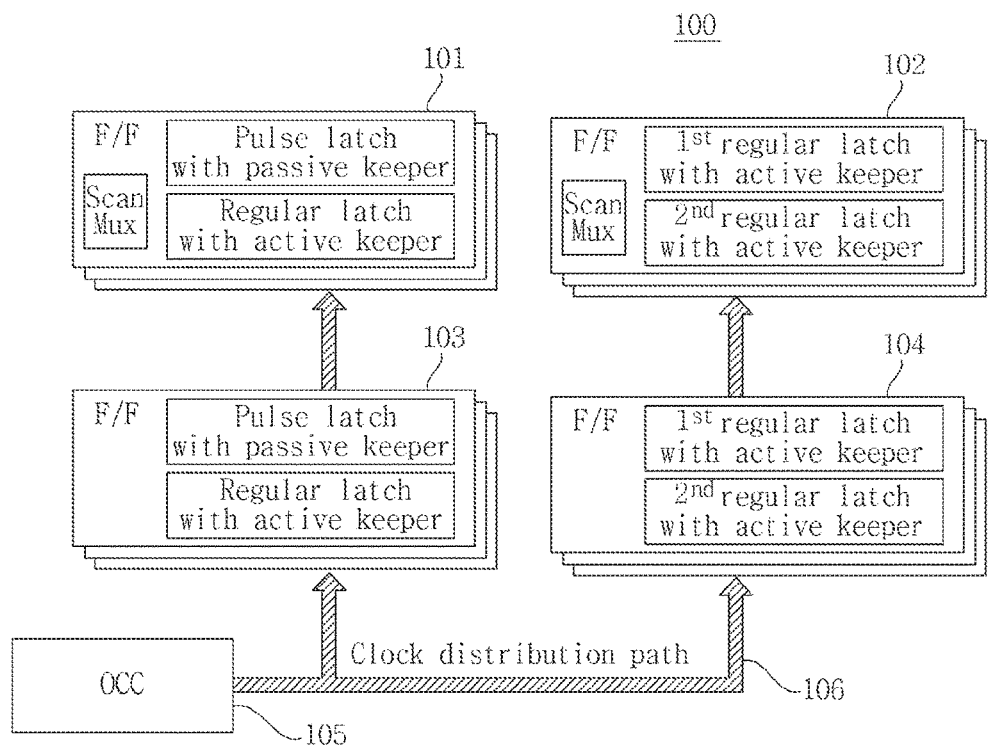
FIG. 5 is a block diagram illustrating a logic circuit, according to an embodiment of the inventive concept.

FIG. 5 is a block diagram illustrating a logic circuit, according to an embodiment of the inventive concept.

Referring to FIG. 5, the logic circuit 100 includes first flip-flop group 101, second flip-flop group 102, third flip-flop group 103 and fourth flip-flop group 104, an on-chip clock controller (OCC) 105, and a clock distribution path 106.

For example, the first flip-flop group 101 may include scan flip-flops using a passive keeper and an active keeper. For example, the first flip-flop group 101 may include the scan flip-flops 110 to 140 shown in FIGS. 3A to 3D.

The second flip-flop group 102 may include scan flip-flops using only an active keeper. For example, the second flip-flop group 102 may include the scan flip-flops 20 shown in FIG. 2A.

Similarly, the third flip-flop group 103 may include flip-flops using a passive keeper and an active keeper, and the fourth flip-flop group 104 may include flip-flops using only an active keeper.

The OCC 105 supplies a clock to each of the first to fourth flip-flop groups 101 to 104 through the clock distribution path 106. The OCC 105 and the clock distribution path 106 will described below with reference to FIG. 6, in detail.

In an embodiment, the logic circuit 100 may include an intellectual property (IP). Moreover, the logic circuit 100 may be implemented with a system-on-chip (SoC).

Figure 6:
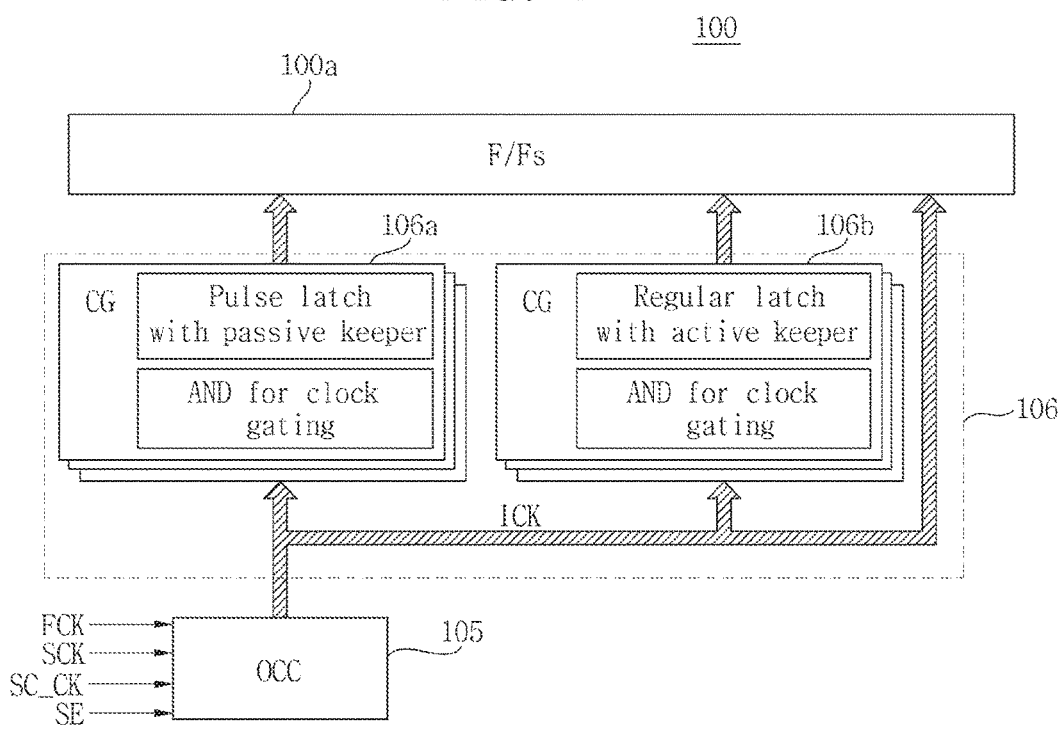
FIG. 6 is a block diagram illustrating a logic circuit, according to another embodiment of the inventive concept.

FIG. 6 is a block diagram illustrating a clock distribution path shown in FIG. 5 in detail, according to an embodiment of the inventive concept.

Referring to FIGS. 5 and 6, the logic circuit 100 includes a plurality of flip-flops 100a, the OCC 105, and the clock distribution path 106.

The clock distribution path 106 may include multiple clock gates, such as a first clock gate 106a and a second clock gate 106b. For example, the first clock gate 106a may store data using a passive keeper, and the second clock gate 106b may store data using an active keeper.

The flip-flops 100a may include the first to fourth flip-flop groups 101 to 104 shown in FIG. 5, for example.

The OCC 105 may receive a first clock signal FCK, a second clock signal SCK, a scan clock signal SC_CK, and a scan enable signal SE.

The first clock signal FCK is a reference clock. The first clock signal FCK may have a minimum frequency for driving the flip-flops 100a. The second clock signal SCK is an operating clock of the logic circuit 100. A frequency of the second clock signal SCK may be an integer number times a frequency of first clock signal FCK. The scan clock signal SC_CK is an operating clock when the logic circuit 100 performs a scan operation. The scan enable signal SE is a signal for activating a scan operation.

The OCC 105 generates an internal clock signal ICK using the first clock signal FCK and the second clock signal SCK. For example, the OCC 105 may control a high-state interval of the internal clock signal ICK to be equal to the high-state interval of the first clock signal FCK. The OCC 105 supplies the internal clock ICK to each of the first clock gate 106a and the second clock gate 106b. Further, the OCC 105 may directly supply the internal clock ICK to the flip-flops 100a.

When any one of the clock enable signal E and the scan enable signal SE is activated, each of the first and second clock gates 106a and 106b provides the internal clock signal ICK to the flip-flops 100a. For example, the first clock gate 106a may provide the internal clock signal ICK to the first and third flip-flop groups 101 and 103, and the second clock gate 106b may provide the internal clock signal ICK to the second and fourth flip-flop groups 102 and 104.

FIG. 7A is a timing diagram for describing an operation of a scan test which detects a fault of the logic circuit shown in FIG. 6 when there is a slow clock, according to an embodiment of the inventive concept.

Referring to FIGS. 5, 6, and 7A, the first clock signal FCK may have a minimum frequency for operating each of the first clock gate 106a, the first flip-flop group 101, and third flip-flop group 103. The second clock signal SCK may have a minimum frequency for operating the logic circuit 100.

The first clock signal FCK may have a higher frequency than the second clock signal SCK. In one embodiment, a frequency of the second clock signal SCK may be an integer number times a frequency of first clock signal FCK. The scan clock signal SC_CK may have a lower frequency than a frequency of the second clock signal SCK.

When the scan enable signal SE is activated (i.e., the scan enable signal SE transitions to a low state), the logic circuit 100 performs a scan operation.

The OCC 105 generates an internal clock signal ICK which is supplied to a scan flip-flop using a passive keeper. The OCC 105 supplies the internal clock signal ICK to the first clock gate 106a and the second clock gate 106b. Each of the first clock gate 106a and the second clock gate 106b supplies the internal clock signal ICK to the flip-flops 100a.

The scan operation may be only operated in a clock having a low frequency. Accordingly, the OCC 105 may adjust the duty cycle with respect to a high-state interval of the internal clock signal ICK. For example, the OCC 105 may control the duty cycle with respect to the high-state interval of the internal clock signal ICK to be equal to the duty cycle with respect to the high-state interval of the first clock signal FCK.

When the scan enable signal SE is activated, the logic circuit 100 performs a normal operation for a clock to detect a fault of the logic circuit 100.

FIG. 7B is a timing diagram for describing an operation of a scan test which measures normal operating speed of the logic circuit shown in FIG. 6 when there is a slow clock, according to an embodiment of the inventive concept.

Referring to FIGS. 6, and 7B, the OCC 105 generates an internal clock signal ICK which is supplied to a scan flip-flop using a passive keeper. The OCC 105 supplies the internal clock signal ICK to the first clock gate 106a and the second clock gate 106b. Each of the first clock gate 106a and the second clock gate 106b supplies the internal clock signal ICK to the flip-flops 100a.

The scan operation may be operated only in a clock having a low frequency. Accordingly, the OCC 105 may adjust the duty cycle with respect to a high-state interval of the internal clock signal ICK. For example, the OCC 105 may control the duty cycle with respect to a high-state interval of the internal clock signal ICK to be equal to the duty cycle with respect to the high-state interval of the first clock signal FCK.

When the scan enable signal SE is activated, the logic circuit 100 performs a normal operation for two clocks to measure a normal operation speed of the logic circuit 100.

FIG. 7C is a timing diagram for describing a normal operation of the logic circuit shown in FIG. 6 when there is a slow clock, according to an embodiment of the inventive concept.

Referring to FIGS. 6, and 7C, the OCC 105 generates an internal clock signal ICK which is supplied to a scan flip-flop using a passive keeper. The OCC 105 supplies the internal clock signal ICK to the first clock gate 106a and the second clock gate 106b. Each of the first clock gate 106a and the second clock gate 106b supplies the internal clock signal ICK to the flip-flops 100a.

The OCC 105 may control the duty cycle with respect to a high-state interval of the internal clock signal ICK to be equal to the duty cycle with respect to the high-state interval of the first clock signal FCK.

When the scan enable signal SE is deactivated, the logic circuit 100 may perform a normal operation. For example, the logic circuit 100 may perform a normal operation in synchronization with the first clock signal FCK or the second clock signal SCK.

Figure 8A:
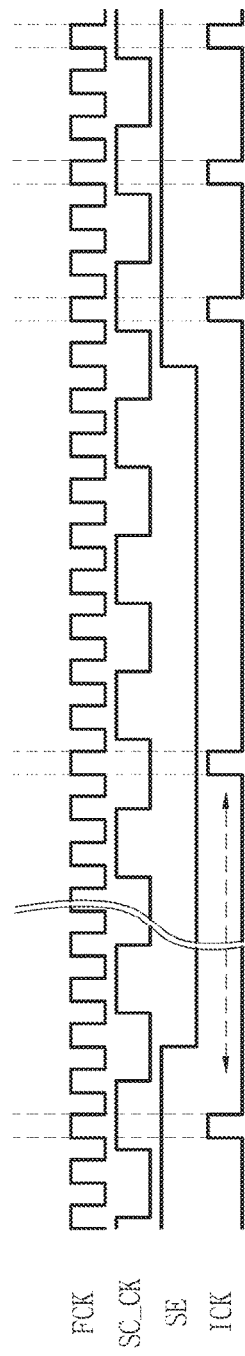
FIG. 8A is a timing diagram for describing an operation of a scan test which detects a fault of the logic circuit when there is no slow clock.

FIG. 8A is a timing diagram for describing an operation of a scan test which detects a fault of the logic circuit shown in FIG. 6 when there is no slow clock, according to an embodiment of the inventive concept.

Referring to FIGS. 5, 6, and 8A, the OCC 105 generates an internal clock signal ICK which is supplied to a scan flip-flop using a passive keeper. The OCC 105 supplies the internal clock signal ICK to the first clock gate 106a and the second clock gate 106b. Each of the first clock gate 106a and the second clock gate 106b supplies the internal clock signal ICK to the flip-flops 100a.

The OCC 105 may control the duty cycle with respect to a high-state interval of the internal clock signal ICK to be equal to the duty cycle with respect to the high-state interval of the first clock signal FCK.

When the scan enable signal SE is activated, the logic circuit 100 performs a normal operation for a clock to detect a fault of the logic circuit 100.

Figure 8B:
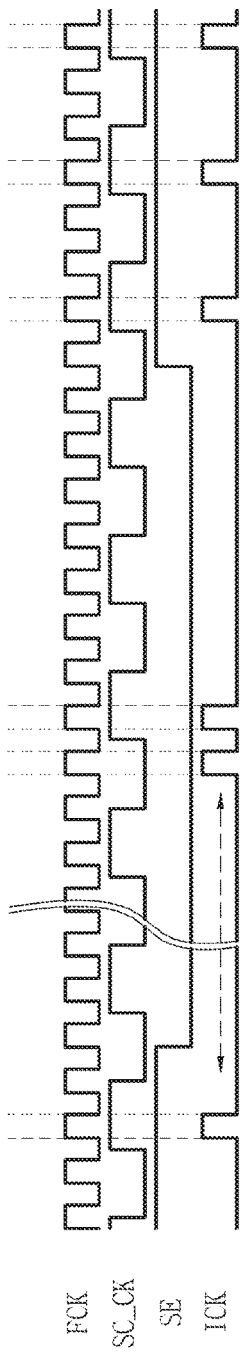
FIG. 8B is a timing diagram for describing an operation of a scan test which verifies a normal operation of the logic circuit when there is no slow clock.

FIG. 8B is a timing diagram for describing an operation of a scan test which measures normal operating speed of the logic circuit shown in FIG. 6 when there is no slow clock, according to an embodiment of the inventive concept.

Referring to FIGS. 6 and 8B, the OCC 105 generates an internal clock signal ICK which is supplied to a scan flip-flop using a passive keeper. The OCC 105 supplies the internal clock signal ICK to the first clock gate 106a and the second clock gate 106b. Each of the first clock gate 106a and the second clock gate 106b supplies the internal clock signal ICK to the flip-flops 100a.

The OCC 105 may control the duty cycle with respect to a high-state interval of the internal clock signal ICK to be equal to the duty cycle with respect to the high-state interval of the first clock signal FCK.

When the scan enable signal SE is activated, the logic circuit 100 performs a normal operation for two clocks to measure a normal operation speed of the logic circuit 100.

Figure 8C:
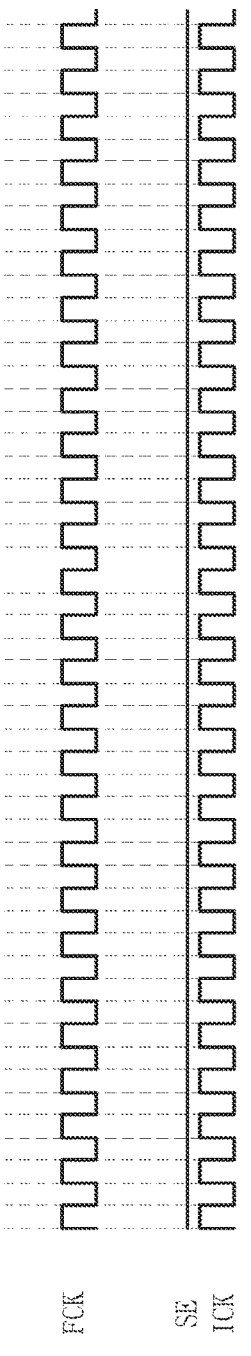
FIG. 8C is a timing diagram for describing a normal operation of the logic circuit shown in FIG. 6 when there is no slow clock.

FIG. 8C is a timing diagram for describing a normal operation of the logic circuit shown in FIG. 6 when there is no slow clock, according to an embodiment of the inventive concept.

Referring to FIGS. 6 and 8C, the OCC 105 generates an internal clock signal ICK which is supplied to a scan flip-flop using a passive keeper. The OCC 105 supplies the internal clock signal ICK to the first clock gate 106a and the second clock gate 106b. Each of the first clock gate 106a and the second clock gate 106b supplies the internal clock signal ICK to the flip-flops 100a.

The OCC 105 may control the duty cycle with respect to a high-state interval of the internal clock signal ICK to be equal to the duty cycle with respect to the high-state interval of the first clock signal FCK.

When the scan enable signal SE is deactivated, the logic circuit 100 performs a normal operation. For example, the logic circuit 100 may perform a normal operation in synchronization with the first clock signal FCK.

Figure 9:
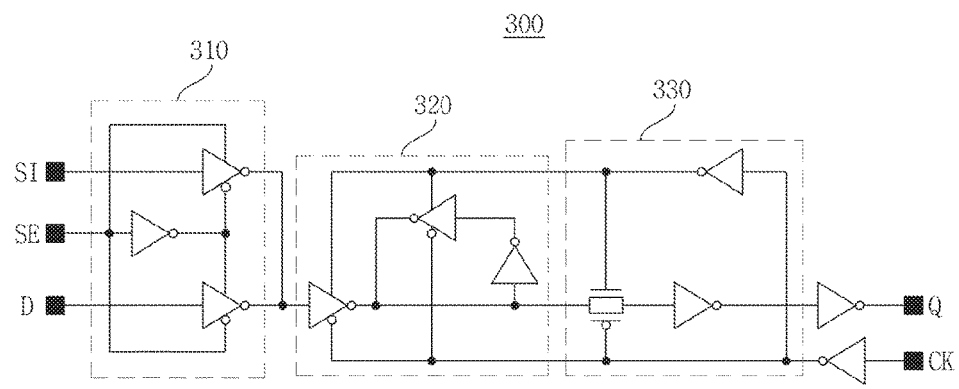
FIG. 9 is a circuit diagram illustrating a scan flip-flop, according to another embodiment of the inventive concept.

FIG. 9 is a circuit diagram illustrating a scan flip-flop, according to another embodiment of the inventive concept.

Referring to FIG. 9, the scan flip-flop 300 includes a scan multiplexer 310, a master latch 320, and a slave latch 330.

The scan multiplexer 310 may include the same structure as the scan multiplexer 21 shown in FIG. 2A. For example, the scan multiplexer 310 includes two tri-state buffers and an inverter.

In response to a scan enable signal SE, the scan multiplexer 310 outputs any one of a scan input signal SI and a data input signal D. For example, the scan multiplexer 310 may include a general multiplexer.

The master latch 320 may store data using an active keeper. For example, the master latch 320 may include two tri-state buffers and an inverter. A tri-state buffer and an inverter in the master latch 320 may be implemented with a back-to-back inverter.

The slave latch 330 may store data using a passive keeper. For example, the slave latch 330 may include a transmission gate and an inverter. In an embodiment, the passive keeper may include a parasitic capacitor. Moreover, a parasitic capacitor may exist in a node between the transmission gate and the inverter. The slave latch 330 may store data during very short time using the parasitic capacitor.

The scan flip-flop 300 may be operated in synchronization with a clock having a return-to-high form. In comparison, the scan flip-flop 110 shown in FIG. 3A may be operated in synchronization with a clock having a return-to-zero form. For example, the internal clock signal ICK shown in FIGS. 7A to 8C has a return-to-zero form.

Figure 10:
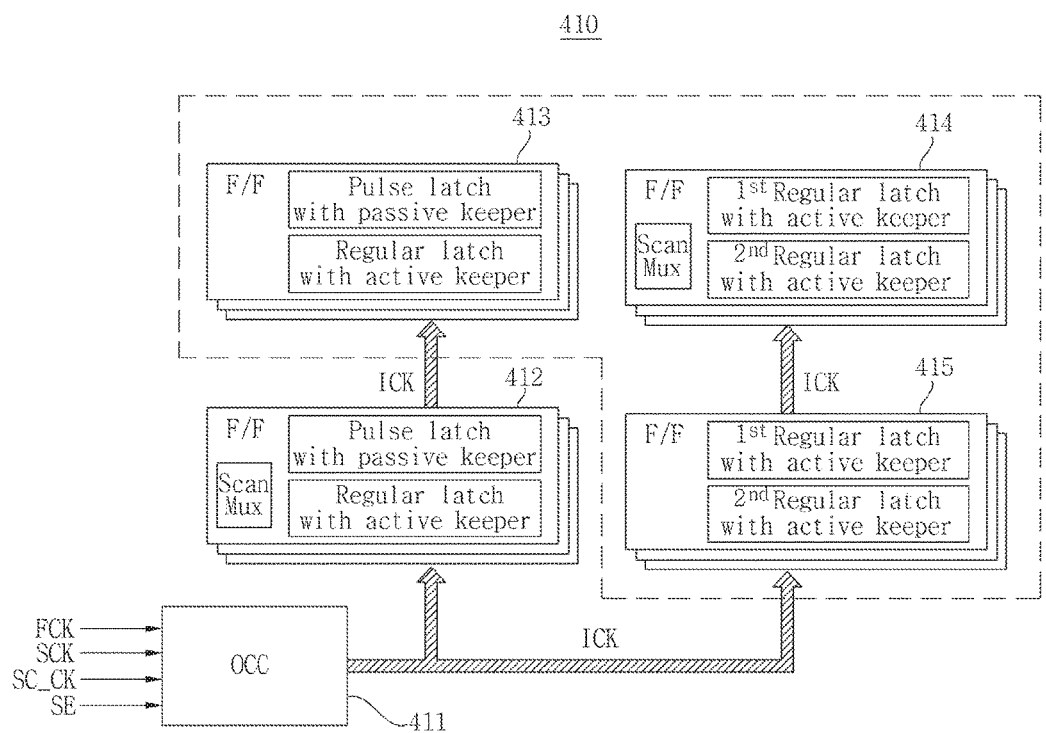
FIG. 10 is a block diagram illustrating an SoC, according to an embodiment of the inventive concept.

FIG. 10 is a block diagram illustrating a SoC, according to an embodiment of the inventive concept.

Referring to FIG. 10, the SoC 410 includes an OCC 411, and a first scan flip-flop 412 that stores data using a passive keeper. The OCC 411 may receive a first clock signal FCK, a second clock signal SCK, a scan clock signal SC_CK, and a scan enable signal SE. The OCC 411 may generate the internal clock signal ICK for driving the first scan flip-flop 412 based on a high-state interval of the first clock signal FCK.

The SoC 410 further includes a first flip-flop 413 that stores data using a passive keeper, a second scan flip-flop 414 that stores data only using an active keeper, and a second flip-flop 415 that stores data only using an active keeper. Each of the first scan flip-flop 412, the first flip-flop 413, the second scan flip-flop 414, and the second flip-flop 415 may be operated in synchronization with the internal clock signal ICK.

Figure 11:
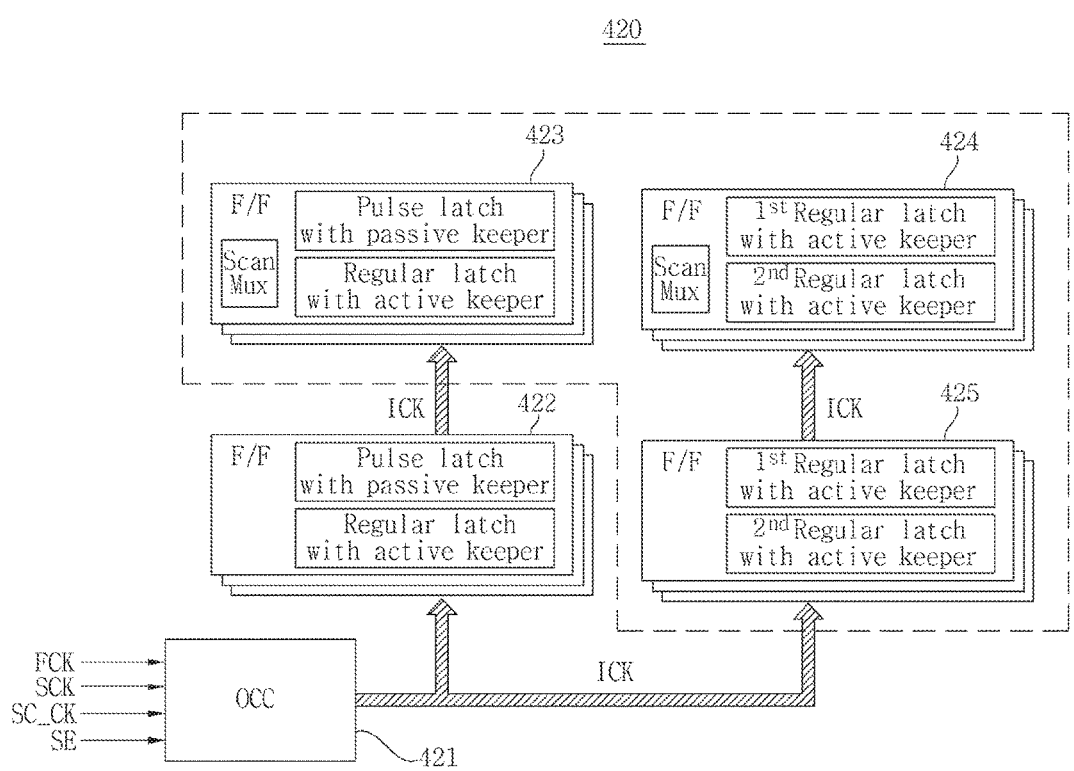
FIG. 11 is a block diagram illustrating an SoC, according to another embodiment of the inventive concept.

FIG. 11 is a block diagram illustrating a SoC, according to another embodiment of the inventive concept.

Referring to FIG. 11, the SoC 420 includes an OCC 421, and a first flip-flop 422 that stores data using a passive keeper. The OCC 421 may receive a first clock signal FCK, a second clock signal SCK, a scan clock signal SC_CK, and a scan enable signal SE. The OCC 421 may generate the internal clock signal ICK for driving the first flip-flop 422 based on a high-state interval of the first clock signal FCK.

The SoC 420 further includes a first scan flip-flop 423 that stores data using a passive keeper, a second scan flip-flop 424 that stores data only using an active keeper, and a second flip-flop 425 that stores data only using an active keeper. Each of the first flip-flop 422, the first scan flip-flop 423, the second scan flip-flop 424, and the second flip-flop 425 may be operated in synchronization with the internal clock signal ICK.

Figure 12:
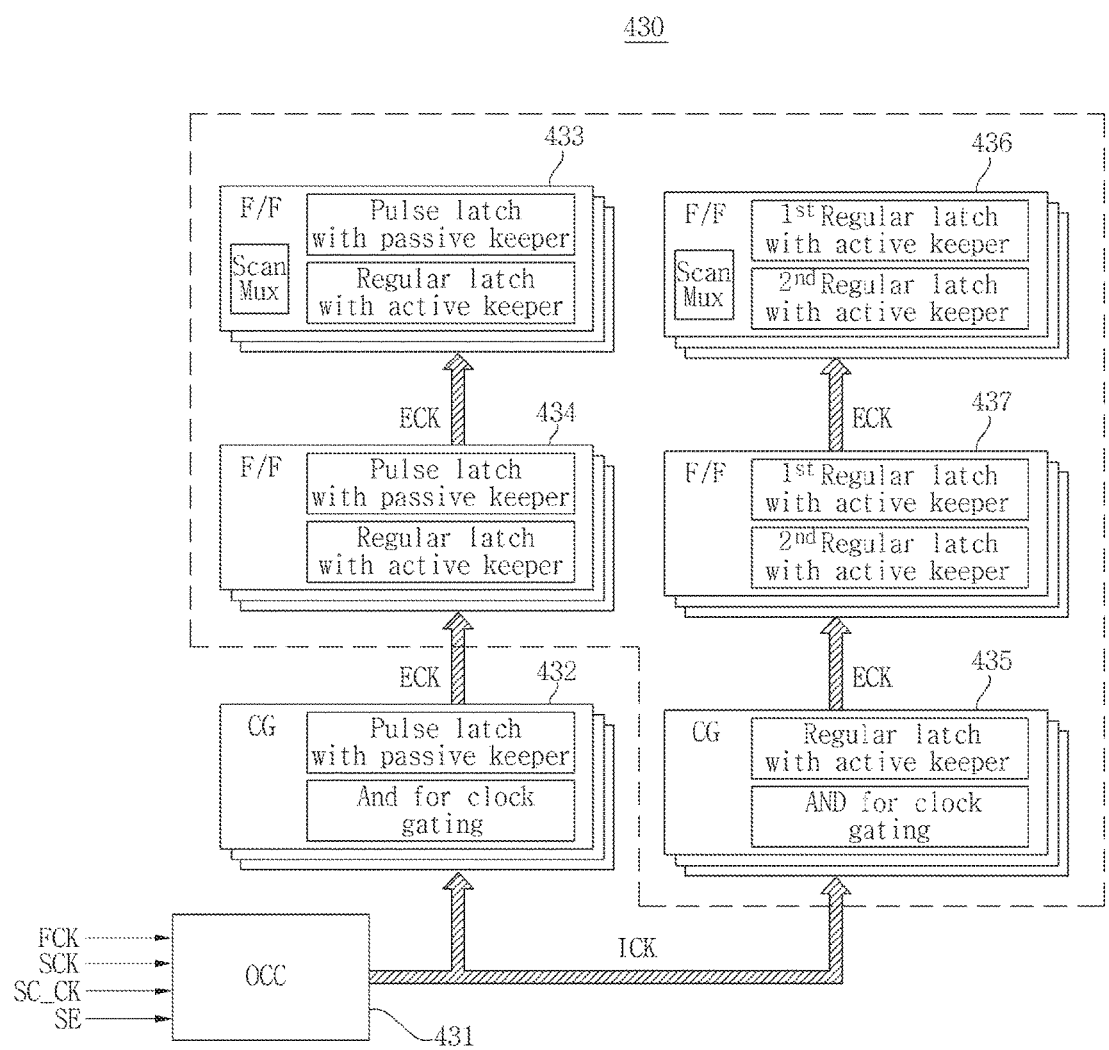
FIG. 12 is a block diagram illustrating an SoC, according to still another embodiment of the inventive concept.

FIG. 12 is a block diagram illustrating a SoC, according to still another embodiment of the inventive concept.

Referring to FIG. 12, the SoC 430 includes an OCC 421, and a first clock gate 432 that stores data using a passive keeper.

The OCC 431 may receive a first clock signal FCK, a second clock signal SCK, a scan clock signal SC_CK, and a scan enable signal SE. The OCC 431 may generate the internal clock signal ICK for driving the first clock gate 432 based on a high-state interval of the first clock signal FCK.

The SoC 430 further includes a first scan flip-flop 433 that stores data using a passive keeper, a first flip-flop 434 that stores data only using a passive keeper, a second clock gate 435 that stores data only using an active keeper, a second scan flip-flop 436 that stores data only using an active keeper, and a second flip-flop 437 that stores data only using an active keeper.

The first clock gate 432 may generate an enable clock ECK using the internal clock signal ICK. That is, when any one of a clock enable signal E and the scan enable signal SE is activated, the first clock gate 432 may output the internal clock signal ICK as the enable clock ECK. The first clock gate 432 supplies the enable clock ECK to the first scan flip-flop 433 and the first flip-flop 434. Each of the first scan flip-flop 433 and the first flip-flop 434 may be operated in synchronization with the enable clock ECK supplied from the first clock gate 432.

Likewise, the second clock gate 435 may generate an enable clock ECK. The second clock gate 435 supplies the enable clock ECK to the second scan flip-flop 436 and the second flip-flop 437. Each of the second scan flip-flop 436 and the second flip-flop 437 may be operated in synchronization with the enable clock ECK supplied from the second clock gate 435.

Figure 13:
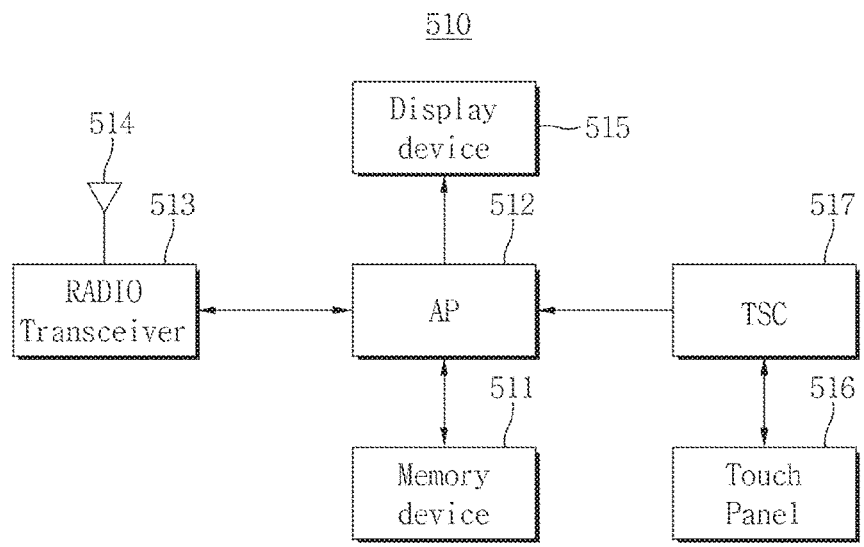
FIG. 13 is a block diagram illustrating a computer system including the logic circuit shown in FIG. 5, according to an embodiment of the inventive concept.

FIG. 13 is a block diagram illustrating a computer system 510 including the logic circuit shown in FIG. 5, according to an embodiment of the inventive concept.

Referring to FIG. 13, the computer system 510 includes a memory device 511, an application processor (AP) 512 including a memory controller for controlling the memory device 511, a radio transceiver 513, an antenna 514, a display device 515, a touch panel 516, and a TSC 517.

The radio transceiver 513 may transmit and receive radio signals through the antenna 514. For example, the radio transceiver 513 may convert a radio signal received through the antenna 514 into a signal which can be processed in the AP 512.

Accordingly, the AP 512 may process a signal outputted from the radio transceiver 513, and transmit the processed signal to the display device 515. Further, the radio transceiver 513 may convert the signal outputted from the AP 512 into a radio signal, and transmit the converted radio signal to an external device through the antenna 514.

The touch panel 516 is configured to receive a touch signal from a user. The touch panel 516 transforms the touch signal into the amount of change of capacitance. The touch panel 516 transmits information about the amount of change of capacitance to the TSC 517. The TSC 517 transforms the information about the amount of change of capacitance into coordinate information. The TSC 517 transmits the coordinate information to the AP 512. In an embodiment, the AP 512 may include the logic circuit 100 shown in FIG. 5, for example.

Figure 14:
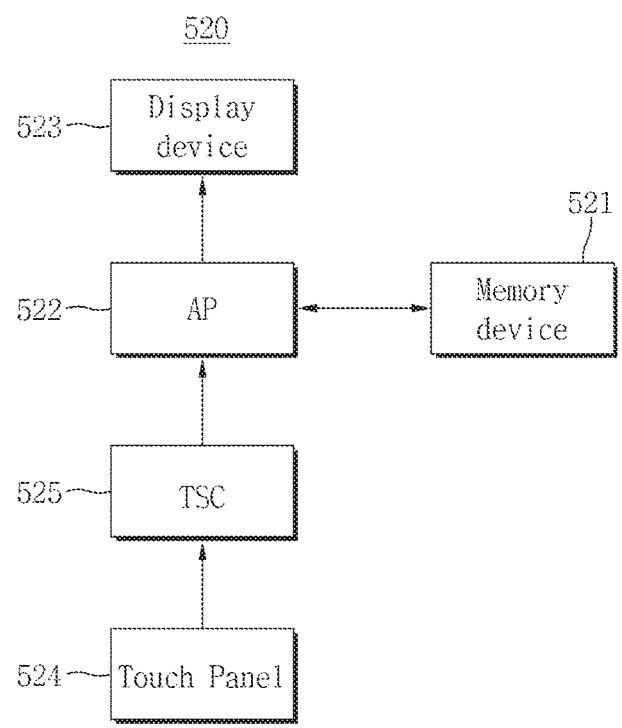
FIG. 14 is a block diagram illustrating a computer system including the logic circuit shown in FIG. 5, according to another embodiment of the inventive concept.

FIG. 14 is a block diagram illustrating a computer system 520 including the logic circuit shown in FIG. 5, according to another embodiment of the inventive concept.

Referring to FIG. 14, the computer system 520 may be a personal computer (PC), a network server, a tablet PC, a netbook, an e-reader, a personal digital assistant (PDA), a portable multimedia player (PMP), an MP3 player, or an MP4 player, for example.

The computer system 520 includes a memory device 521, an AP 522 including a memory controller for controlling a data processing operation of the memory device 521, a display device 523, a touch panel 524, and a TSC 525.

The touch panel 524 is configured to receive a touch signal from a user. The touch panel 524 transforms the touch signal into the amount of change of capacitance. The touch panel 524 transmits information about the amount of change of capacitance to the TSC 525. The TSC 525 transforms the information about the amount of change of capacitance into coordinate information. The TSC 525 transmits the coordinate information to the AP 522.

The AP 522 displays data stored in the memory device 521 through the display device 523 according to data inputted through the touch panel 524. In an embodiment, the AP 522 may include the logic circuit 100 shown in FIG. 5, for example.

Figure 15:
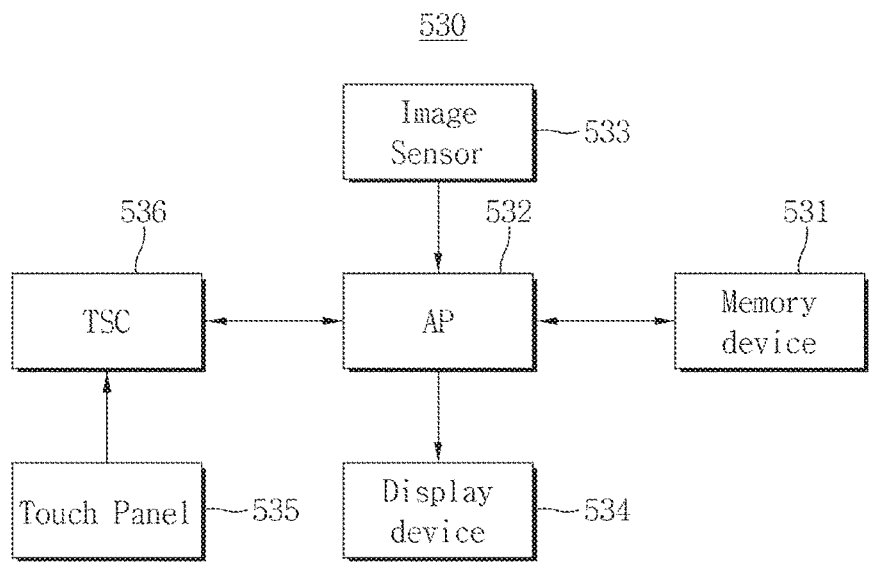
FIG. 15 is a block diagram illustrating a computer system including the logic circuit shown in FIG. 5, according to still another embodiment of the inventive concept.

FIG. 15 is a block diagram illustrating a computer system 530 including the logic circuit shown in FIG. 5, according to still another embodiment of the inventive concept.

Referring to FIG. 15, the computer system 530 may be an image processing device, such as, a digital camera, a mobile phone, a smart phone or a tablet PC on which the digital camera are installed, for example.

The computer system 530 includes a memory device 531, an AP 532 including a memory controller for controlling a data processing operation, for example, a write operation or a read operation, of the memory device 531, an image sensor 533, a display device 534, a touch panel 535, and a TSC 536.

The image sensor 533 converts an optical image into digital signals, and the converted digital signals are transmitted to the AP 532. Under control of the AP 532, the converted digital signals are displayed through the display device 534, or stored in the memory device 531. Further, the data stored in the memory device 531 is displayed through the display device 534 under the control of the AP 532.

The touch panel 535 is configured to receive a touch signal from a user. The touch panel 535 transforms the touch signal into the amount of change of capacitance. The touch panel 535 transmits information about the amount of change of capacitance to the TSC 536. The TSC 536 transforms the information about the amount of change of capacitance into coordinate information. The TSC 536 transmits the coordinate information to the AP 532. In an embodiment, the AP 532 may include the logic circuit 100 shown in FIG. 5, for example.

Figure 16:
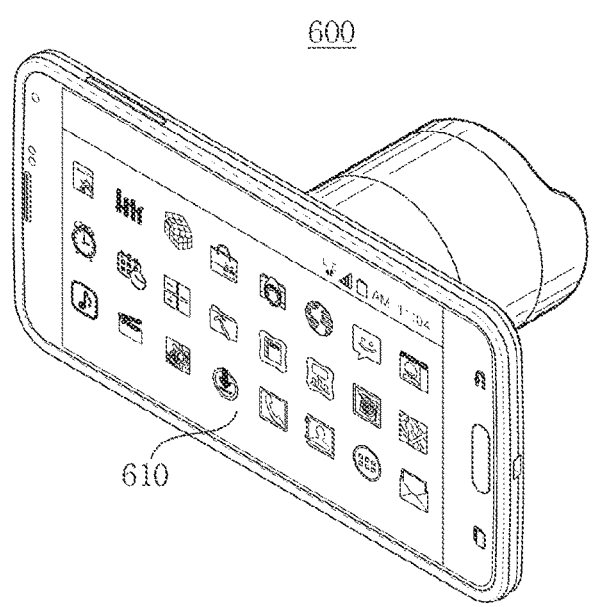
FIG. 16 illustrates a digital camera device, including the logic circuit shown in FIG. 5.

FIG. 16 illustrates a digital camera device 600 including the logic circuit shown in FIG. 5, according to another embodiment of the inventive concept.

Referring to FIG. 16, the digital camera device 600 is operated with an Android™ OS. In various embodiment, the digital camera device 600 may include a Galaxy Camera™ or Galaxy Camera2™, for example.

The digital camera device 600 may include a touch panel 610 configured to receive a touch input from a user, a TSC to control the touch panel 610, an image sensor to capture an image or a moving image and an AP to control the image sensor. In the embodiment, the digital camera device 600 may include the logic circuit 100 shown in FIG. 5, for example.

Figure 17A:
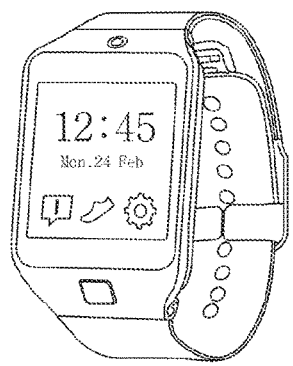
FIGS. 17A to 17C illustrate wearable devices, including the logic circuit shown in FIG. 5.
Figure 17B:
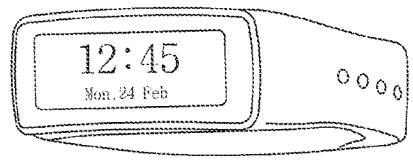
Figure 17C:
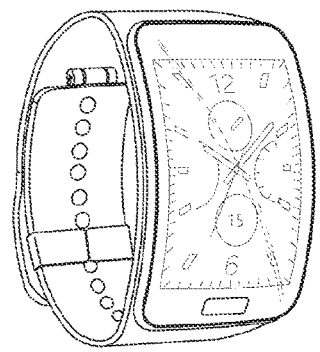

FIGS. 17A to 17C illustrate wearable devices including the logic circuit shown in FIG. 5, according to embodiments of the inventive concept.

Referring to FIGS. 17A and 17C, each of a first wearable device 710, the second wearable device 730 and the third wearable device 730 has a type of a wrist watch. Each of the first to third wearable devices 710 to 730 is operated with an Android™ OS or TIZEN™ OS, for example.

In the various embodiments, the first wearable device 710 may include a Galaxy Gear2™, the second wearable device 720 may include a Galaxy Gear Fit™, and the third wearable device 730 may include a Galaxy Gear S™.

Each of the first to third wearable devices 710 to 730 may include an AP which is operated with an Android™ operating system (OS) or TIZEN™ OS, an image sensor which captures an image or a moving image and a display device which displays the photographed image or a moving image.

In the embodiment, each of the first to third wearable devices 710 to 730 may include the logic circuit 100 shown in FIG. 5, for example.

The inventive concept may be applied to an SoC including an OCC and a mobile device having the same.

An SoC according to an embodiment of the inventive concept may include a logic circuit using a passive keeper. Accordingly, the SoC may be implemented with a small chip area. Further, the SoC may be operated with low-power consumption. The embodiment of the inventive concept can be implemented in a SoC including an OCC, and a mobile device including the same, for example.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A system-on-chip (SoC) including a logic circuit, wherein the logic circuit comprises:
   a first group of scan flip-flops each configured to store data using a passive keeper and an active keeper;
   a second group of scan flip-flops each configured to store data using an active keeper;
   an on-chip clock controller configured to receive a reference clock for driving the logic circuit, to generate an internal clock based on a high-state interval of the reference clock, and to adjust a duty cycle of the internal clock to provide an adjusted internal clock,
   wherein the on-chip clock controller sets a high-state interval of the adjusted internal clock to a substantially equivalent level with the high-state interval of the reference clock; and
   a clock distribution path comprising at least one first clock gate configured to provide the adjusted internal clock to the first group of scan flip-flops, and at least one second clock gate configured to provide the adjusted internal clock to the second group of scan flip-flops.

2. The SoC of claim 1, wherein the substantially equivalent level of the high-state interval of the reference clock is equal to or similar to the high-state interval of the adjusted internal clock.

3. The SoC of claim 1, wherein the logic circuit further comprises at least one intellectual property (IP), and some of the first group of scan flip-flops and the second group of scan flip-flops form a scan chain and receive scan data through the scan chain while a scan test is performed to detect a fault in the at least one IP.

4. The SoC of claim 1, wherein some of the first group of scan flip-flops comprise:
a multiplexer configured to output one of scan data and normal data in synchronization with the adjusted internal clock in response to a scan enable signal;
a first latch configured to store one of the scan data and the normal data using the passive keeper; and
a second latch configured to store data transmitted from the first latch using the active keeper.

5. The SoC of claim 4, wherein the active keeper includes a back-to-back inverter.

6. The SoC of claim 4, wherein the first latch comprises:
a first element configured to pass data in synchronization with the adjusted internal clock; and
a second element configured to store the data transmitted from the first element using the passive keeper.

7. The SoC of claim 4, wherein the adjusted internal clock has a return-to-zero form.

8. The SoC of claim 1, wherein some of the first group of scan flip-flops comprise:
a multiplexer configured to output one of scan data and normal data in synchronization with the adjusted internal clock in response to a scan enable signal;
a first latch configured to store one of the scan data and the normal data using the active keeper; and
a second latch configured to store data transmitted from the first latch using the passive keeper.

9. The SoC of claim 1, wherein in some of the first group of scan flip-flops the passive keeper is used as a slave latch and the active keeper is used as a master latch.

10. The SoC of claim 1, wherein the clock distribution path is further configured to provide the adjusted internal clock directly to some scan flip-flops among the first group of scan flip-flops and the second group of scan flip-flops.

11. A system-on-chip (SoC) including a logic circuit, wherein the logic circuit comprises:
a first group of flip-flops each configured to store data using a passive keeper and an active keeper;
a second group of scan flip-flops each configured to store data using an active keeper;
an on-chip clock controller configured to receive a reference clock for driving the logic circuit and receive a second clock, to generate an internal clock using the reference clock and the second clock based on a high-state interval of the reference clock, and to adjust a duty cycle of the internal clock to provide an adjusted internal clock,
wherein the on-chip clock controller sets a high-state interval of the adjusted internal clock to a substantially equivalent level with the high-state interval of the reference clock; and
a clock distribution path comprising at least one first clock gate configured to provide the adjusted internal clock to the first group of flip-flops, and at least one second clock gate configured to provide the adjusted internal clock to the second group of scan flip-flops.

12. The SoC of claim 11, wherein the substantially equivalent level of the high-state interval of the reference clock is equal to or similar to the high-state interval of the adjusted internal clock.

13. The SoC of claim 11, wherein some of the first group of flip-flops comprise:
a first latch configured to store data using the passive keeper; and
a second latch configured to store the data transmitted from the first latch using the active keeper.

14. The SoC of claim 13, wherein the adjusted internal clock has a return-to-zero form.

15. The SoC of claim 11, wherein the logic circuit further comprises a scan flip-flop configured to store data using a second passive keeper.

16. The SoC of claim 11, wherein a frequency of the second clock is an integer number of times a frequency of the reference clock.

17. A system-on-chip (SoC) including a logic circuit, wherein the logic circuit comprises:
a clock gate configured to store data using a passive keeper and an active keeper; and
an on-chip clock controller configured to receive a reference clock for driving the logic circuit and receive a second clock, to generate an internal clock using the reference clock and the second clock based on a high-state interval of the reference clock, and to adjust a duty cycle of the internal clock to provide an adjusted internal clock to the clock gate,
wherein the on-chip clock controller controls a high-state interval of the adjusted internal clock to be equal to the high-state interval of the reference clock, and
wherein the clock gate comprises
a latch configured to store one of a clock enable signal and a scan enable signal using the passive keeper, and
an AND gate configured to perform an AND operation with respect to the stored one of the clock enable signal and the scan enable signal and the adjusted internal clock.

18. The SoC of claim 17, wherein the latch comprises:
a first element configured to pass data in synchronization with the adjusted internal clock; and
a second element configured to store the data transmitted from the first element using the passive keeper.

19. The SoC of claim 17, wherein the logic circuit further comprises a flip-flop configured to store data using a second passive keeper and a scan flip-flop configured to store data using a third passive keeper.

20. The SoC of claim 17, wherein a frequency of the second clock is an integer number of times a frequency of the reference clock.

* * * * *